(12) United States Patent
Stevens et al.

(10) Patent No.: US 9,960,081 B1
(45) Date of Patent: May 1, 2018

(54) METHOD FOR SELECTIVE ETCHING USING DRY FILM PHOTORESIST

(71) Applicant: NXP USA, INC., Austin, TX (US)

(72) Inventors: Colin Bryant Stevens, Austin, TX (US); Lianjun Liu, Chandler, AZ (US); Ruben B. Montez, Cedar Park, TX (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/422,511

(22) Filed: Feb. 2, 2017

(51) Int. Cl.
  *H01L 21/00* (2006.01)
  *H01L 21/768* (2006.01)
  *H01L 21/311* (2006.01)

(52) U.S. Cl.
  CPC .. *H01L 21/76898* (2013.01); *H01L 21/31144* (2013.01); *H01L 21/76804* (2013.01); *H01L 21/76831* (2013.01); *H01L 21/76879* (2013.01)

(58) Field of Classification Search
  CPC ......... H01L 21/76898; H01L 21/76804; H01L 21/31144; H01L 21/76831; H01L 21/76879
  See application file for complete search history.

(56) References Cited

U.S. PATENT DOCUMENTS

| 5,258,264 | A | 11/1993 | Mathad et al. |
| 6,897,148 | B2 | 5/2005 | Halahan et al. |
| 7,612,428 | B2 | 11/2009 | Park et al. |
| 8,603,846 | B2 | 12/2013 | Cohen et al. |
| 2010/0084747 | A1* | 4/2010 | Chen .......... H01L 21/6835 257/621 |
| 2012/0106117 | A1* | 5/2012 | Sundaram ......... H01L 23/49827 361/808 |

(Continued)

FOREIGN PATENT DOCUMENTS

| EP | 2 463 896 A1 | 6/2012 |
| WO | WO-2014/020479 A2 | 2/2014 |

OTHER PUBLICATIONS

Spiering, V.L., et al; "Planarization and fabrication of bridges across deep grooves or holes in silicon using a dry film photoresist followed by an etch back"; J. Michromech. Microeng.5; Printed in the UK; retrieved from the Internet http://eprints.eemcs.utwente.nl/13848/01/JMMME_5_189.pdf on Nov. 8, 2016; pp. 189-192 (1995).

(Continued)

*Primary Examiner* — Richard Booth
(74) *Attorney, Agent, or Firm* — Charlene R. Jacobsen (57) ABSTRACT

A method for selective etching using a dry film photoresist includes forming an opening through a substrate from a first surface to expose a stop layer at a second surface of the substrate. A material layer is formed over an inner surface of the opening and over the stop layer. The dry film photoresist is applied over the first surface of the substrate and over the opening. A second photoresist is applied on the dry film photoresist. First and second aligned holes are formed in the second photoresist and the dry film photoresist, respectively. The holes are approximately centered over the opening and are smaller in diameter than the opening so that a composite structure of the dry film photoresist and the second photoresist overhangs edges of the opening. The material layer is removed from the stop layer by etching via the first and second holes.

20 Claims, 7 Drawing Sheets

(56) References Cited

U.S. PATENT DOCUMENTS

2015/0137323 A1    5/2015  Zhou et al.
2015/0371978 A1*  12/2015  Guiducci .......... H01L 21/76898
                                                              438/107

OTHER PUBLICATIONS

Johnson, Donald W. et al; "SUEX Dry Film Resist—A new Material for High Aspect Ratio Lithography"; retrieved from the Internet on Nov. 8, 2016 http://www.camd.lsu.edu/microfabrication/highlights/DJ_AR2012_SUEX%20overview.pdf; 8 pages (Oct. 2008).

Huang, Bo Kai et al; "Integration Challenges of TSV Backside Via Reveal Process"; IEEE 63rd Electronic Components and Technology Conference; IEE Xplore ; 3 pages (Aug. 8, 2013).

Olson, Stephen et al; "TSV reveal etch for 3D integration"; 2011 IEEE International 3D Systems Integration Conference (3DIC); IEEE Xplore; 4 pages (Aug. 16, 2012).

van Huylenbroeck, Steffan et al; "Small Pitch, High Aspect Ratio Via-Last TSV Module"; IEEE 66th Electronic Components and Technology Conference; pp. 43-49 (2016).

* cited by examiner

METHOD FOR SELECTIVE ETCHING USING DRY FILM PHOTORESIST

TECHNICAL FIELD OF THE INVENTION

The present invention relates generally to the selective etching of three dimensional structures during integrated circuit processing. More specifically, the present invention relates to the selective removal of a dielectric isolation layer from the bottom of an opening to form a through silicon via (TSV) in an integrated circuit.

BACKGROUND OF THE INVENTION

Conventional integrated circuit (IC) processing entails patterning and etching on planar to semi-planar surfaces. Consequently, the process of fabricating three-dimensional structures is an ongoing problem that effects both through-silicon via (TSV) formation and microelectromechanical systems (MEMS) processes.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a method for patterning and etching a three dimensional structure in an integrated circuit using a dry film resist. More particularly, the method entails the fabrication of a vertical electrical connection, commonly referred to as through-silicon via (TSV), and a methodology for defining a pattern at the bottom of an opening for a TSV and etching the opening in accordance with the pattern, while leaving other regions of the opening untouched by the etchant. In accordance with the methodology, a dry film photoresist is applied over an opening after the opening has been formed and after a dielectric isolation layer has been created in the opening. A second photoresist can be formed on top of the dry film resist. Aligned holes that are smaller than the opening can be formed through the second photoresist and the dry film resist. The various inventive concepts and principles embodied herein can confine subsequent etching processes via the aligned holes to only the desired region within the opening. Further, by covering the opening with the dry film resist before patterning, there is no concern of chemicals entering the opening during development. Additionally, the methodology may be readily implemented in "via-last" processing for improved reliability, yield gain, and cost savings.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
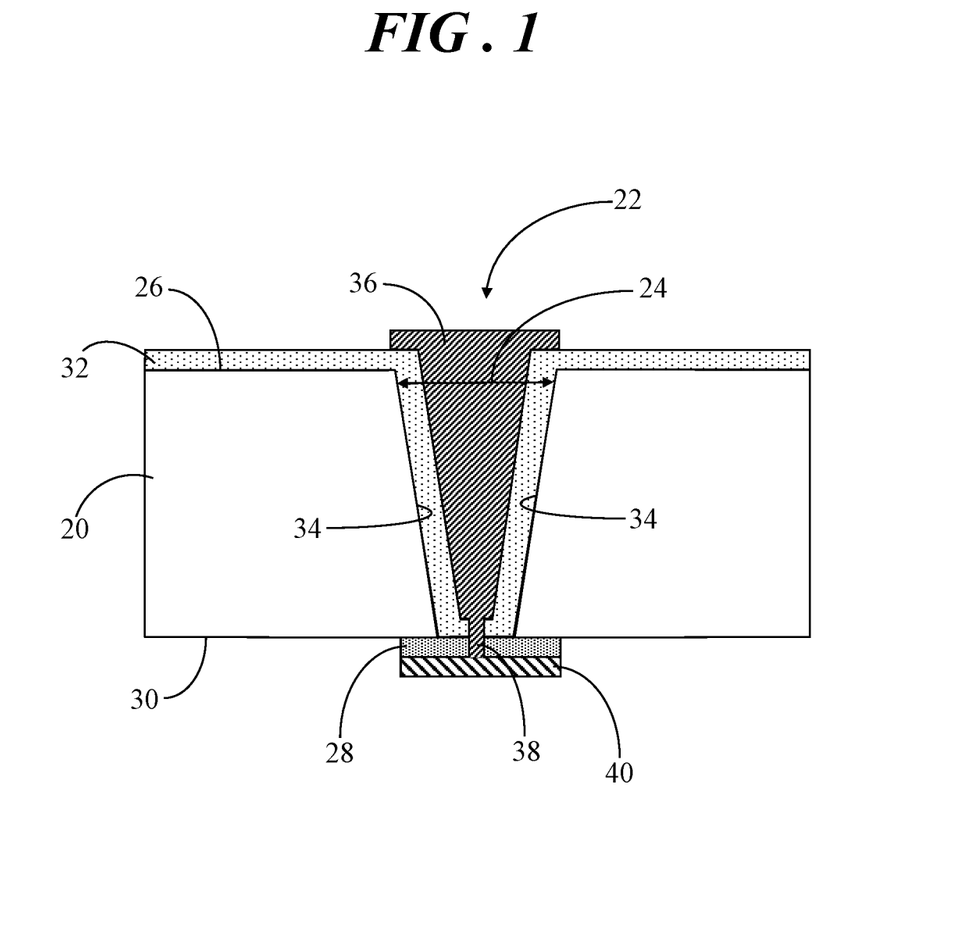
FIG. 1 shows a side sectional view of a substrate containing a vertical electrical connection, e.g., through silicon via (TSV), in accordance with an embodiment.

FIG. 1 shows a side sectional view of a substrate 20 containing a vertical electrical connection 22 in accordance with an embodiment. Such vertical electrical connections are commonly referred to as through-silicon vias. Accordingly, vertical electrical connection 22 is referred to hereinafter as through-silicon via (TSV) 22. TSV 22 passes completely through substrate 20, which may be a silicon wafer or die. As is known to those skilled in the art, TSVs are high performance interconnects that pass through a silicon wafer in order to establish an electrical connection from the active side to the backside of the die, thus providing the shortest interconnect path. TSVs can be used as an alternative to wire-bond and flip chips to create three dimensional packages and three dimensional integrated circuits because the density of the TSVs can be substantially higher and the length of the electrical interconnects is typically shorter. Only one TSV 22 is shown for simplicity of illustration. It should be readily apparent that an integrated circuit device can include any suitable quantity of TSVs 22.

In general, TSV 22 is formed by etching an opening 24 from a first surface 26 of substrate 20 and extending through substrate 20 to expose a stop layer 28 at a second surface 30 of substrate 20. A material layer, such as a dielectric isolation layer 32, is deposited over first surface 26 of substrate 20, an inner surface 34 of opening 24, and over stop layer 28. Dielectric isolation layer 32 provides electrical isolation to the surrounding substrate 20. Thereafter, opening 24 is filled with an electrically conductive material 36. In accordance with an embodiment, prior to filling opening 24 with conductive material 36, methodology entails removal of a portion of dielectric isolation layer 32 and stop layer 28 to form a contact 38 to an electrically conductive bond pad 40 at second surface 30, and more particularly on stop layer 28. Moreover, the methodology entails removal of the portion of dielectric isolation layer 32 and stop layer 28 at the bottom of opening 24 without also degrading dielectric isolation layer 32 on inner surface 34 of opening 24.

There are some generalized processes for forming TSVs based upon when the TSVs are created during integrated circuit (IC) processing. These include a "via-first" process and a "via-last" process. Via-first methodology is a process in which the TSVs are formed prior to metallization (e.g., prior to the formation of bond pads, interconnects, or any other feature) on the backside (e.g., second surface 30) of the substrate. In these techniques, the TSV is created and thereafter, the TSV may be exposed at backside by grinding the backside of the substrate through the dielectric isolation layer. This grinding process may be suitable for "via first" methodologies. However, if there are important features (e.g., bond pads, interconnects, distribution layers, and the like) that have already been formed on the back side of the substrate, then a grind method is not a suitable process.

Via-last methodology is a process in which the TSVs are manufactured after metallization (e.g., bond pads, interconnects, distribution layers, and the like). In via-last processing, only low temperature processes (for example, less than four hundred degrees Celsius) can be used for etching, dielectric deposition, and conductive material fill because of the presence of metal on the wafer. At low processing temperatures, deposition is non-conformal for very deep TSVs. Thus, via-last processing may be implemented to produce vias having a lower TSV aspect ratio then via-first TSVs. The reduced TSV aspect ratio in via-last processing is beneficial for achieving uniform deposition of both the dielectric isolation layer and the electrically conductive fill material. However, a drawback of reducing TSV aspect ratio is that a standard anisotropic plasma etch will not only etch the bottom of the via opening, but may etch the inner surface of the opening as well. This can create a conductive path through the side of the TSV, where isolation is needed, to the surrounding substrate.

In both via-first and via-last processes, the TSV must be electrically isolated from the surrounding substrate. One prior art technique for achieving this electrical isolation is to create an electrically isolated region around the TSV. However, this prior art technique can use excessive space that could be used for other purposes. Accordingly, in order to achieve space savings, formation of a dielectric isolation layer lining the inner surface of the opening of the TSV is increasingly being implemented. Typically, the dielectric isolation layer is deposited on the top surface of the substrate along with the inner surface and bottom of the TSV opening. Thereafter, a portion of the dielectric isolation layer is etched away at the bottom of the TSV opening in order to enable appropriate electrical connections.

A conventional method of etching the dielectric isolation layer in the bottom of the opening is to solely rely on a highly directional etch process to remove the dielectric isolation layer from the bottom of the opening while leaving the dielectric isolation layer on the inner surface, i.e., sidewalls of the opening. This method might work sufficiently for high aspect ratio TSVs. However, as TSVs become smaller and deeper, etching within high aspect ratio TSVs becomes increasingly difficult. Further, the entire surface of the substrate must be etched and care must be taken to ensure that the surface oxide (i.e., dielectric isolation layer deposited on the top surface of the substrate) is not completely removed due to the faster surface etch rate of the etchant relative to the etch rate at the bottom of the opening.

The methodology described herein enables the removal of dielectric isolation layer 32 at the bottom of opening 24 and the formation of a contact 38 between TSV 22 and conductive bond pad 40. Further the etched region at the bottom of opening 24 can be confined to only the bottom of opening 24 leaving inner surface 34 of opening 24 untouched. Such methodology is useful for selectively etching the areas of a highly nonplanar cavity, and is particularly advantageous for, but not limited to, via-last processing.

Figure 2:
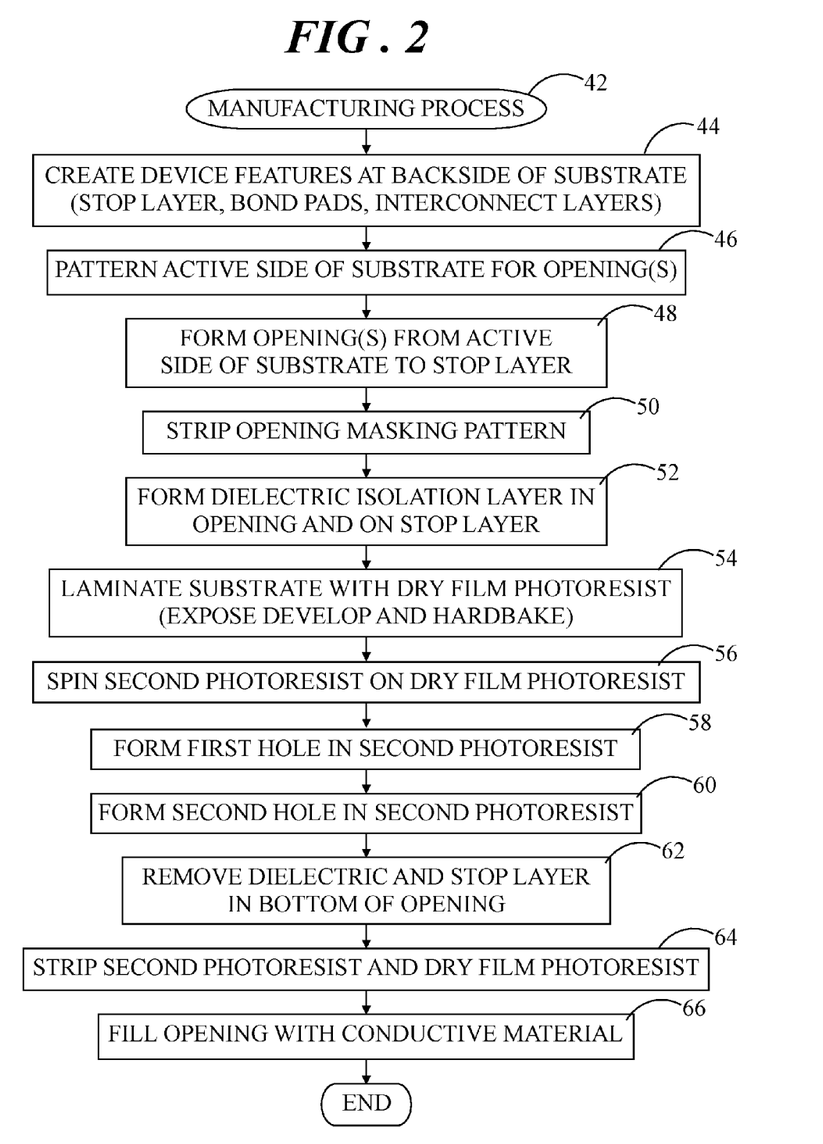
FIG. 2 shows a flowchart of a manufacturing process for fabricating the TSV in accordance with another embodiment.

Referring now to FIGS. 1 and 2, FIG. 2 shows a flowchart of a manufacturing process 42 for fabricating TSV 22 in accordance with another embodiment. Manufacturing process 42 enables a via-last process. The general operational blocks of manufacturing process 42 are presented in connection with FIG. 2. Subsequent FIGS. 3-12 provide more detailed illustrations associated with the various operations presented in FIG. 2. Manufacturing process 42 will be described in terms of the fabrication of a single TSV 22 for simplicity. It should be understood, however, that a multiplicity of TSVs 22 may be fabricated concurrently on a single wafer, e.g., substrate 20. Further, the fabrication of integrated circuits (ICs) in substrate 20 may occur before, during, or after fabrication of TSV 22. However, fabrication of ICs are also not described herein for simplicity.

At a block 44, device features are created at the back side (e.g., second surface 30) of substrate 20. The device features may be stop layer 28 and metallization such as, bond pad 40, interconnects, and/or interconnect layers. At a block 46, the active side (e.g., first surface 26) of substrate 20 is patterned for opening 24. At a block 48, opening 24 is formed from the active side (first surface 26) to stop layer 28. Following formation of opening 24 at block 48, the masking pattern for opening 24 is stripped from first surface 26 at a block 50.

At a block 52, dielectric isolation layer 32 is formed over first surface, inner surface 34 of opening 24, and on stop layer 28 at the bottom of opening 24. At a block 54, a dry film photoresist is laminated over first surface 26 of substrate 20 and over opening 24. More particularly, the dry film photoresist is laminated to dielectric isolation layer 32 that is deposited on first surface 26. Thus, the dry film photoresist forms a tent structure over opening 24. Following lamination, the dry film photoresist may be developed and hardbaked to make the dry film photoresist stable for further processing. Following application of the dry film photoresist to substrate 20 and over opening 24, a second photoresist is applied on the dry film photoresist at a block 56. The second photoresist may be a liquid photoresist that is spun onto the dry film photoresist.

At a block 58, a first hole is formed in the second photoresist. The first hole may be patterned and etched in the second photoresist at a location that is approximately centered over opening 24. Next, at a block 60, a second hole is formed in the dry film photoresist via the first hole such that the first and second holes are aligned and the first and second holes are smaller than opening 24. At a block 62, dielectric isolation layer 32 and stop layer 28 are removed from the bottom of opening 24. Following block 62, the second photoresist and the dry film photoresist are stripped from first surface 26 of substrate 20 at a block 64. At a block 66, opening 24 is filled with electrically conductive material 36 and in the region at the bottom of opening 24 at which dielectric isolation layer 32 and stop layer 28 were removed to form TSV 22 having contact 38 in electrical contact with bond pad 40. Thereafter, manufacturing process 42 ends.

Figure 3:
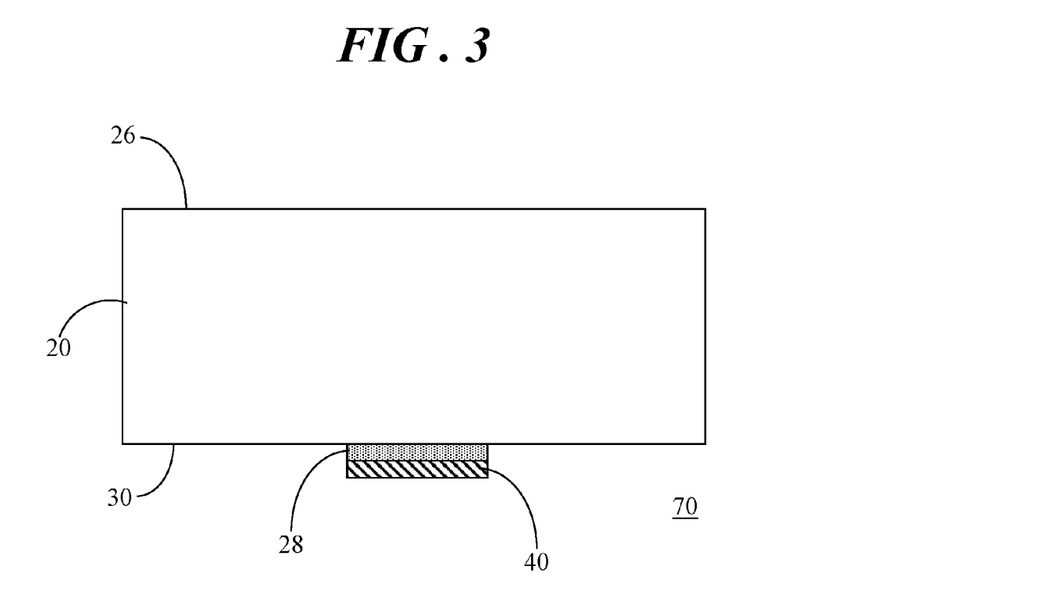
FIG. 3 shows a side sectional view of a structure at an initial stage of processing in accordance with the manufacturing process of FIG. 2.

Now referring to FIGS. 2 and 3, FIG. 3 shows a side sectional view of a structure at an initial stage 70 of processing in accordance with block 44 of manufacturing process 42 (FIG. 2). As shown, stop layer 28 and conductive bond pad 40 are formed on second surface 30 of substrate 20 using conventional fabrication processes.

Figure 4:
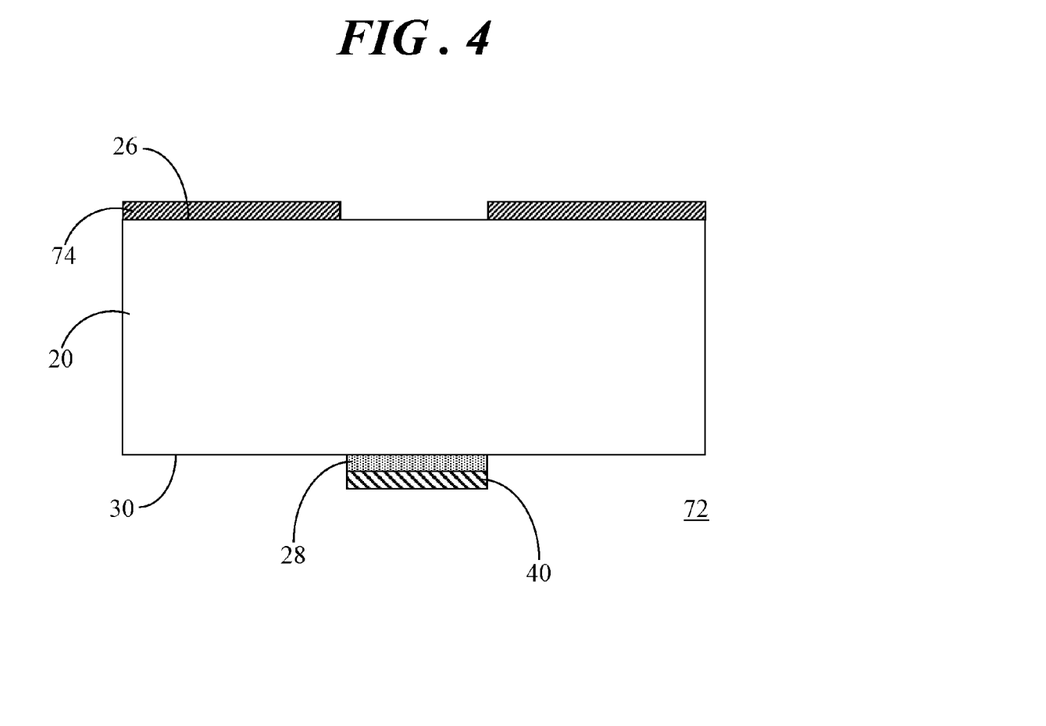
FIG. 4 shows a side sectional view of the structure of FIG. 3 at a subsequent stage of processing in accordance with the manufacturing process.

Referring to FIGS. 2 and 4, FIG. 4 shows a side sectional view of the structure of FIG. 3 at a subsequent stage 72 of processing in accordance with block 46 of manufacturing process 42. At stage 72, a hard photoresist mask 74 for opening 24 (FIG. 1) is patterned and deposited on first surface 26 of substrate 20 per conventional fabrication processes.

Figure 5:
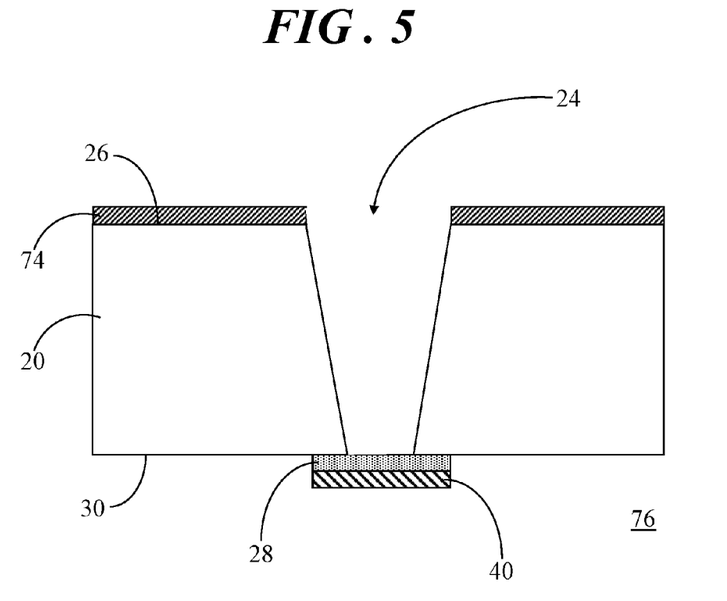
FIG. 5 shows a side sectional view of the structure of FIG. 4 at a subsequent stage of processing in accordance with the manufacturing process.

Referring to FIGS. 2 and 5, FIG. 5 shows a side sectional view of the structure of FIG. 4 at a subsequent stage 76 of processing in accordance with block 48 of manufacturing process 42. As shown at stage 76, opening 24 is etched from first surface 26 of substrate 20 and extending through substrate 20 to expose stop layer 28 at second surface 30 of substrate 20. Opening 24 may be etched using, for example, a deep reactive ion etch (DRIE) process, laser etching, or any other known or upcoming process.

Figure 6:
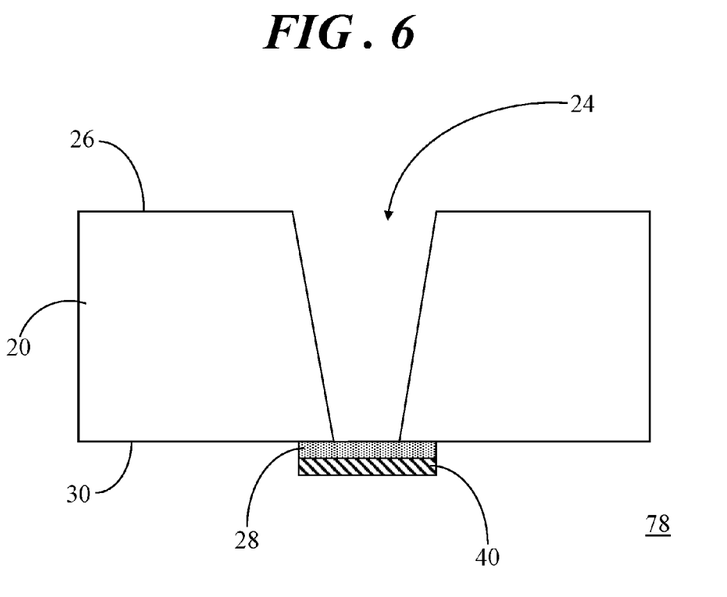
FIG. 6 shows a side sectional view of the structure of FIG. 5 at a subsequent stage of processing in accordance with the manufacturing process.

Referring to FIGS. 2 and 6, FIG. 6 shows a side sectional view of the structure of FIG. 5 at a subsequent stage 78 of processing in accordance with block 50 of manufacturing process 42. At stage 78, hard mask 74 (FIG. 5) has been stripped from first surface 26 of substrate 28 per conventional fabrication processes.

Figure 7:
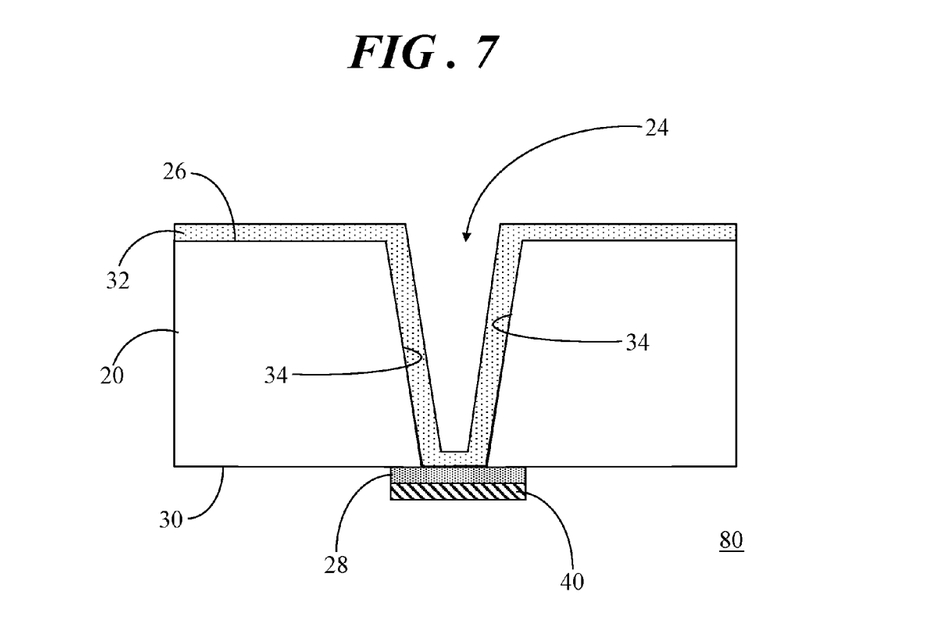
FIG. 7 shows a side sectional view of the structure of FIG. 6 at a subsequent stage of processing in accordance with the manufacturing process.

Referring to FIGS. 2 and 7, FIG. 7 shows a side sectional view of the structure of FIG. 6 at a subsequent stage 80 of processing in accordance with block 52 of manufacturing process 42. In particular, dielectric isolation layer 32 has been deposited on first surface 26 of substrate 20, over inner surface 34 of opening 24 and over stop layer 28 at the bottom of opening 24.

Figure 8:
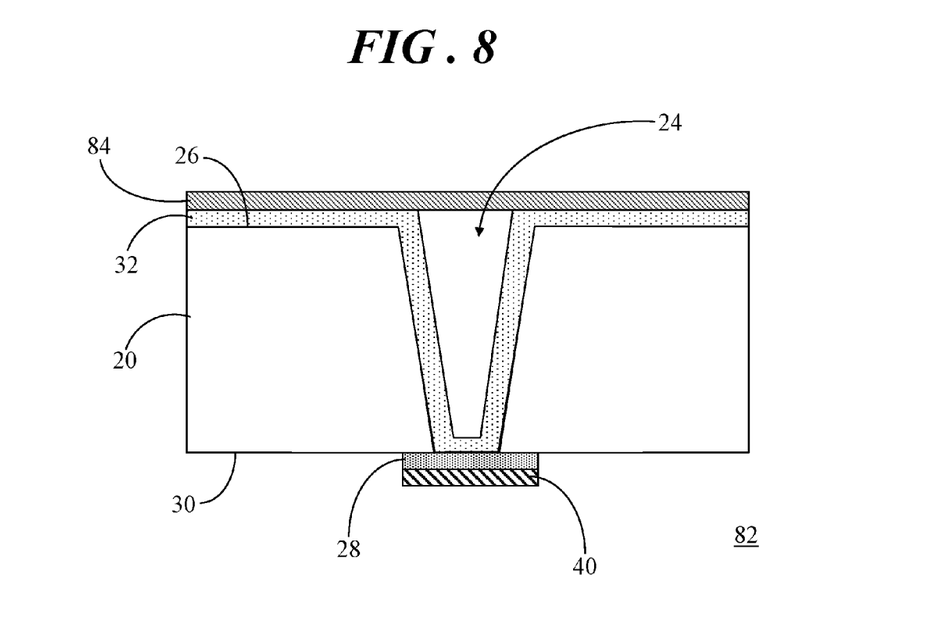
FIG. 8 shows a side sectional view of the structure of FIG. 7 at a subsequent stage of processing in accordance with the manufacturing process.

Referring to FIGS. 2 and 8, FIG. 8 shows a side sectional view of the structure of FIG. 7 at a subsequent stage 82 of processing in accordance with block 54 of manufacturing process 42. As shown, a dry film photoresist 84 is applied on first surface 26 of substrate 20 and over opening 24. Dry film photoresist 84, also referred to as dry film resist, is a semi-solid film that is applied onto dielectric isolation layer 32 that was previously deposited on first surface 26 and over opening 24 by lamination. In some embodiments, dry film photoresist 84 may be a negative dry film resist in which the portion of dry film photoresist 84 that is exposed to light becomes insoluble to the photoresist developer. The unexposed portion of the negative dry film resist is dissolved by the photoresist developer. Relative to a positive resist, a negative resist has excellent adhesion to silicon, is less expensive, and has excellent wet chemical resistance. Dry film application block 54 may also entail developing and hardbaking dry film photoresist 84 without patterning in order to increase the thermal, chemical, and physical stability of the developed dry film photoresist 84 for subsequent processes. Accordingly, following block 54, a tent structure of dry film photoresist 84 is formed over and effectively seals opening 24.

Figure 9:
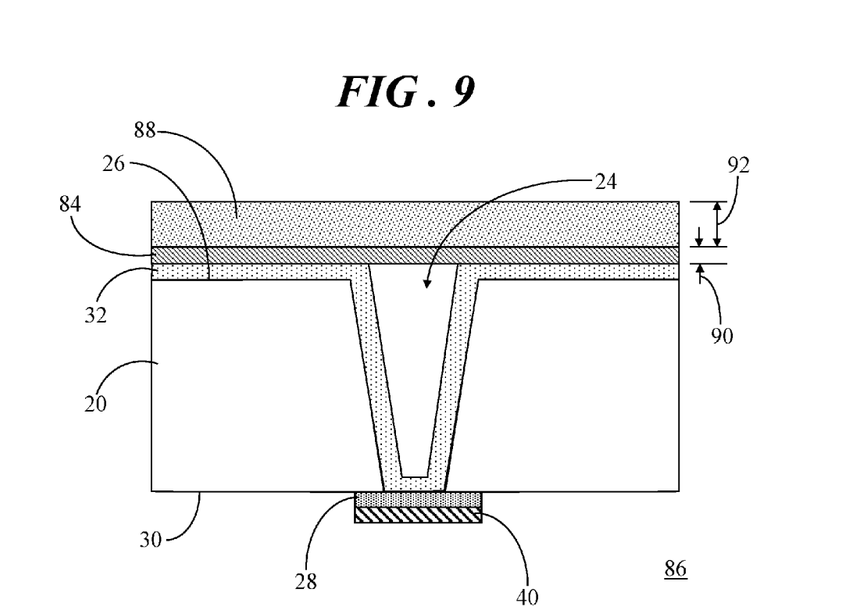
FIG. 9 shows a side sectional view of the structure of FIG. 8 at a subsequent stage of processing in accordance with the manufacturing process.

Referring to FIGS. 2 and 9, FIG. 9 shows a side sectional view of the structure of FIG. 8 at a subsequent stage 86 of processing in accordance with block 56 of manufacturing process 42. At stage 86, a second photoresist 88 is applied onto dry film photoresist 84. Second photoresist 84 may be applied as a liquid that is spin-coated over dry film photoresist 84 to ensure uniformity of thickness. In some embodiments, dry film photo resist 84 exhibits a first thickness 90, and following spin-coating of the liquid photoresist, second photoresist 88 exhibits a second thickness 92 that is greater than first thickness 90. This greater thickness of second photoresist 88 provides a suitable platform for performing patterning and etching of second photoresist 88.

Figure 10:
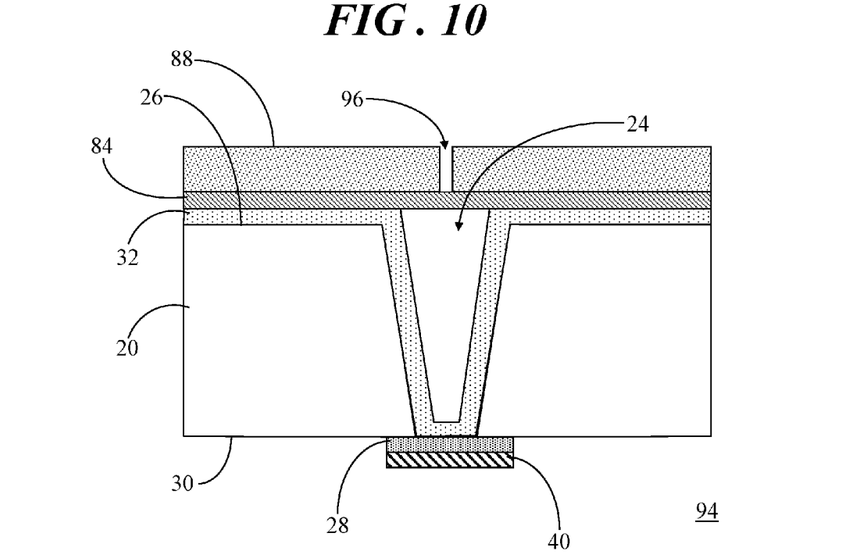
FIG. 10 shows a side sectional view of the structure of FIG. 9 at a subsequent stage of processing in accordance with the manufacturing process.

Referring to FIGS. 2 and 10, FIG. 10 shows a side sectional view of the structure of FIG. 9 at a subsequent stage 94 of processing in accordance with block 58 of manufacturing process 42. At stage 94, a first hole 96 is patterned and etched into second photoresist 88 at a location that is approximately centered over opening 24. First hole 96 may be formed using any suitable etching process, such as wet etching, plasma etching, and the like. A wet etching process may be suitable since dry film photo resist 84 effectively seals opening 24 to prevent the entry of chemicals and etching byproducts into opening 24.

Figure 11:
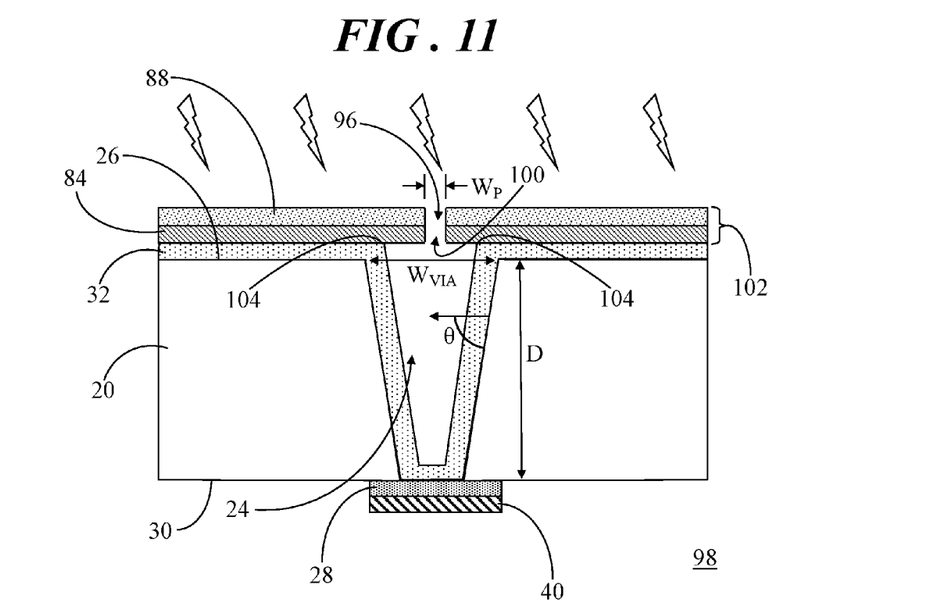
FIG. 11 shows a side sectional view of the structure of FIG. 10 at a subsequent stage of processing in accordance with the manufacturing process.

Referring to FIGS. 2 and 11, FIG. 11 shows a side sectional view of the structure of FIG. 10 at a subsequent stage 98 of processing in accordance with block 60 of manufacturing process 42. At stage 98, a second hole 100 is formed in dry film photoresist 84. In an embodiment, second hole 100 is formed using a directional plasma etching to transfer the second photoresist pattern into dry film photo resist 84 so that second hole 100 is aligned with first hole 96. By way of example, second hole 100 can be formed using a completely dry oxygen reactive ion etch (RIE) process.

A diameter of first and second holes 96, 100 is smaller than a diameter of opening 24 so that a composite structure 102 of dry film photoresist 84 and second photoresist 88 overhangs an edge 104 of opening 24. This composite structure 102 functions as a collimator that can be implemented to define a patterned etch on a highly three dimensional feature, such as within opening 24, thereby providing the ability to etch only specific sections of the structure, while leaving other sections untouched. The diameter of second hole 100 formed in dry film photoresist 84 preferably conforms to the following equation:

$$W_P < W_{VIA} - 2\frac{D}{\tan\theta} - W_{ALIGNMENT} \qquad (1)$$

where $W_P$ is the diameter of second hole 100, $W_{via}$ is the diameter of opening 24, θ is a taper angle of opening 24, D is the depth of opening 24, and $W_{ALIGNMENT}$ is the alignment tolerance of the etch process used to form second hole 100 via first hole 96.

Figure 12:
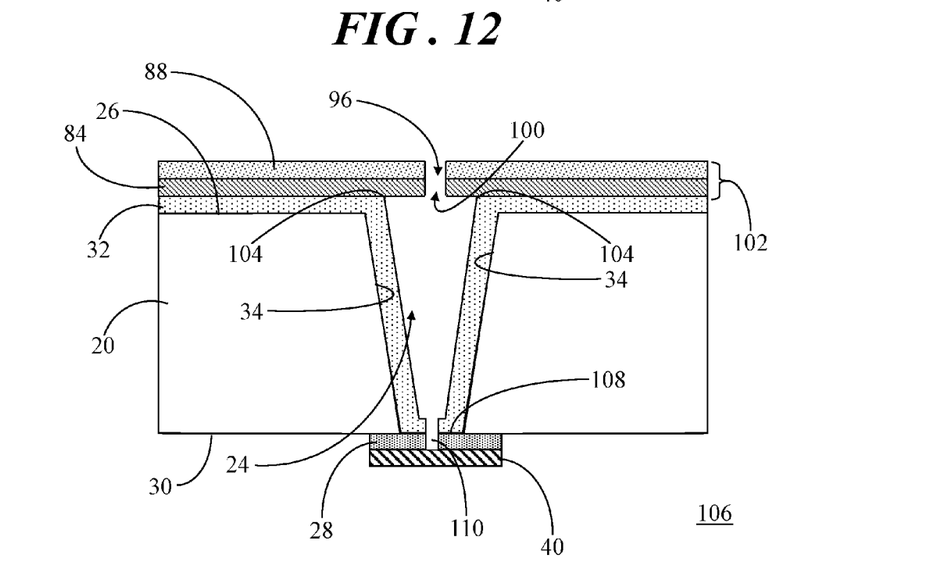
FIG. 12 shows a side sectional view of the structure of FIG. 11 at a subsequent stage of processing in accordance with the manufacturing process.

Referring to FIGS. 2 and 12, FIG. 12 shows a side sectional view of the structure of FIG. 11 at a subsequent stage 106 of processing in accordance with block 62 of manufacturing process 42. At stage 106, dielectric isolation layer 32 located at a bottom 108 of opening 24 is removed by etching via first and second holes 96, 100. Additionally, this etching process removes a portion of stop layer 28.

Accordingly, a channel 110 is created between opening 24 and bond pad 40. A directional plasma oxide/nitride etch process may be performed to create channel 110 in bottom 108 of opening 24. The collimating function of composite structure 102 focuses the etch process to only remove dielectric isolation layer 32 and stop layer 28 at bottom 108 of opening 24, and prevents removal of dielectric isolation layer 32 from inner surface 34 of opening 24.

Thereafter, second photoresist 88 and dry film resist 84 are removed in accordance with block 64 of manufacturing process 42 using, for example, a standard plasma processing, leaving intact the dielectric solation layer 32 deposited on first surface 26 of substrate 20. Following block 64, opening 24 and channel 110 are filled with electrically conductive material 36 (FIG. 1) to produce TSV 22 (FIG. 1) in accordance with block 66 of manufacturing process 42. Opening 24 and channel 110 may be filled by physical sputter, electroplating, chemical vapor deposition (CVD), and the like in accordance with known and upcoming practices.

Thus, a method for patterning and etching a three dimensional structure in an integrated circuit using a dry film resist has been described. An embodiment of a method comprises forming an opening from a first surface of a substrate and extending through the substrate to expose a stop layer at a second surface of the substrate, forming a material layer in the opening over an inner surface of the opening and over the stop layer, applying a dry film photoresist over the first surface of the substrate and over the opening, and applying a second photoresist on the dry film photoresist. The method further comprises forming a first hole through the second photoresist at a location of the opening, forming a second hole through the dry film photoresist via the first hole, such that the second hole is aligned with the first hole, wherein the first and second holes are smaller than the opening, and removing the material layer from the stop layer via the first and second holes.

Another embodiment of a method comprises creating a stop layer on a second surface of a substrate, creating an electrically conductive bond pad on the stop layer, and following creation of the stop layer and the electrically conductive bond pad, forming an opening from a first surface of the substrate and extending through the substrate to expose the stop layer at the second surface of the substrate. The method further comprises forming a material layer in the opening over an inner surface of the opening and over the stop layer, applying a dry film photoresist over the first surface of the substrate and over the opening, applying a second photoresist on the dry film photoresist, forming a first hole through the second photoresist at a location of the opening, forming a second hole through the dry film photoresist via the first hole, such that the second hole is aligned with the first hole, wherein the first and second holes are smaller than the opening, wherein following the forming the first hole and the second hole, a composite structure of the dry film photoresist and the second photoresist overhangs edges of the opening, and removing the material layer from the stop layer via the first and second holes, wherein the composite structure overhanging the edges of the opening prevents removal of the material layer from the inner surface of the opening.

The methodology can confine etching processes to only the desired region within a highly non-planar cavity or opening. Further, by covering the opening before patterning with the dry film photoresist, there is no concern of chemicals entering the opening during development. Additionally, the methodology can be readily implemented in a "via-last" processing approach to yield improved reliability, yield gain, and cost savings.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method comprising:
   forming an opening from a first surface of a substrate and extending through said substrate to expose a stop layer at a second surface of said substrate;
   forming a material layer in said opening over an inner surface of said opening and over said stop layer;
   applying a dry film photoresist over said first surface of said substrate and over said opening;
   applying a second photoresist on said dry film photoresist;
   forming a first hole through said second photoresist at a location of said opening;
   forming a second hole through said dry film photoresist via said first hole, such that said second hole is aligned with said first hole, wherein said first and second holes are smaller than said opening; and
   removing said material layer from said stop layer via said first and second holes.

2. The method of claim 1 further comprising:
   prior to said forming said opening, creating said stop layer on said second surface of said substrate; and
   creating an electrically conductive bond pad on said stop layer.

3. The method of claim 2 wherein:
   said removing further comprises removing said stop layer to expose said bond pad; and
   said method further comprises filling said opening with electrically conductive material such that said electrically conductive material contacts said bond pad.

4. The method of claim 1 wherein said applying said dry film photoresist is performed by lamination.

5. The method of claim 1 wherein said applying said dry film photoresist comprises developing and hardbaking said dry film photoresist.

6. The method of claim 1 wherein said applying said dry film photoresist forms a tent structure over said opening.

7. The method of claim 1 wherein said second photoresist comprises a liquid photoresist, and said applying said second photoresist comprises spinning said liquid photoresist onto said dry film photoresist.

8. The method of claim 1 wherein said dry film photoresist exhibits a first thickness and following application of said second photoresist, said second photoresist exhibits second thickness that is greater than said first thickness.

9. The method of claim 1 wherein following said forming said first hole and said second hole, a composite structure of said dry film photoresist and said second photoresist overhangs edges of said opening.

10. The method of claim 9 wherein said composite structure overhanging said edges of said opening prevents removal of said material layer from said inner surface of said opening.

11. The method of claim 1 wherein said forming said second hole comprises performing a dry etching process to form said second hole.

12. The method of claim 1 wherein:
said forming said opening comprises producing said opening having a first diameter, $W_{via}$, at said first surface and a second diameter at said second surface, said second diameter being less than said first diameter to yield that a taper angle, θ, between said first and second surfaces that is less than ninety degrees, and said opening having a depth, d, between said first and second surfaces; and
said forming said second hole comprises forming said second hole having a third diameter, $W_p$, defined by:

$$W_P < W_{VIA} - 2\frac{D}{\tan\theta} - W_{ALIGNMENT}$$

wherein $W_{ALIGNMENT}$ is an alignment tolerance of an etch process used to form said second hole via said first hole.

13. The method of claim 1 further comprising removing said second photoresist and said dry film photoresist following removal of said material layer from said stop layer.

14. A method comprising:
forming an opening from a first surface of a substrate and extending through said substrate to expose a stop layer at a second surface of said substrate;
forming a material layer in said opening over an inner surface of said opening and over said stop layer;
applying a dry film photoresist over said first surface of said substrate and over said opening by lamination to form a tent structure over said opening;
applying a second photoresist on said dry film photoresist by spinning a liquid photoresist onto said dry film photoresist;
forming a first hole through said second photoresist at a location of said opening;
forming a second hole through said dry film photoresist via said first hole, such that said second hole is aligned with said first hole, wherein said first and second holes are smaller than said opening; and
removing said material layer from said stop layer via said first and second holes.

15. The method of claim 14 wherein following said forming said first hole and said second hole, a composite structure of said dry film photoresist and said second photoresist overhangs edges of said opening.

16. The method of claim 14 wherein said forming said second hole comprises performing a dry etching process to form said second hole.

17. The method of claim 1 wherein:
said forming said opening comprises producing said opening having a first diameter, $W_{via}$, at said first surface and a second diameter at said second surface, said second diameter being less than said first diameter to yield that a taper angle, θ, between said first and second surfaces that is less than ninety degrees, and said opening having a depth, d, between said first and second surfaces; and
said forming said second hole comprises forming said second hole having a third diameter, $W_p$, defined by:

$$W_P < W_{VIA} - 2\frac{D}{\tan\theta} - W_{ALIGNMENT}$$

wherein $W_{ALIGNMENT}$ is an alignment tolerance of an etch process used to form said second hole via said first hole.

18. A method comprising:
creating a stop layer on a second surface of a substrate;
creating an electrically conductive bond pad on said stop layer;
following creation of said stop layer and said electrically conductive bond pad, forming an opening from a first surface of said substrate and extending through said substrate to expose said stop layer at said second surface of said substrate;
forming a material layer in said opening over an inner surface of said opening and over said stop layer;
applying a dry film photoresist over said first surface of said substrate and over said opening;
applying a second photoresist on said dry film photoresist;
forming a first hole through said second photoresist at a location of said opening;
forming a second hole through said dry film photoresist via said first hole, such that said second hole is aligned with said first hole, wherein said first and second holes are smaller than said opening, wherein following said forming said first hole and said second hole, a composite structure of said dry film photoresist and said second photoresist overhangs edges of said opening; and
removing said material layer from said stop layer via said first and second holes, wherein said composite structure overhanging said edges of said opening prevents removal of said material layer from said inner surface of said opening.

19. The method of claim 18 wherein said forming said second hole comprises performing a dry etching process to form said second hole.

20. The method of claim 18 wherein:
said removing further comprises removing said stop layer to expose said bond pad; and
said method further comprises removing said second photoresist and said dry film photoresist following removal of said material layer and said stop layer and filling said opening with electrically conductive material such that said electrically conductive material contacts said bond pad.

* * * * *